United States Patent
Chen et al.

(10) Patent No.: US 8,822,303 B2
(45) Date of Patent: Sep. 2, 2014

(54) METHOD FOR MANUFACTURING SEMICONDUCTOR DEVICE

(75) Inventors: Tsu-Chiang Chen, Taipei (TW); Yu-Mei Liao, Kaohsiung (TW); Cheng-Kuen Chen, Taipei (TW)

(73) Assignee: Powerchip Technology Corporation, Hsinchu (TW)

( * ) Notice: Subject to any disclaimer, the term of this patent is extended or adjusted under 35 U.S.C. 154(b) by 6 days.

(21) Appl. No.: 13/620,730

(22) Filed: Sep. 15, 2012

(65) Prior Publication Data

US 2014/0004665 A1 Jan. 2, 2014

(30) Foreign Application Priority Data

Jun. 27, 2012 (TW) .............................. 101123012 A

(51) Int. Cl.
*H01L 21/76* (2006.01)
(52) U.S. Cl.
USPC .................... 438/421; 438/619; 257/E21.573
(58) Field of Classification Search
USPC .......................................... 438/421, 619, 411
See application file for complete search history.

(56) References Cited

U.S. PATENT DOCUMENTS

| | | | |
|---|---|---|---|
| 5,407,860 A | 4/1995 | Stoltz et al. | |
| 5,641,712 A | 6/1997 | Grivna et al. | |
| 5,736,446 A | 4/1998 | Wu | |
| 5,759,913 A | 6/1998 | Fulford, Jr. et al. | |
| 6,291,030 B1 | 9/2001 | Chao et al. | |
| 6,867,086 B1 * | 3/2005 | Chen et al. | 438/219 |
| 7,087,998 B2 | 8/2006 | Lee et al. | |
| 7,705,392 B2 * | 4/2010 | Yonemochi et al. | 257/315 |
| 8,129,264 B2 | 3/2012 | Kim et al. | |
| 2010/0015813 A1 | 1/2010 | McGinnis et al. | |

FOREIGN PATENT DOCUMENTS

TW I254408 5/2006

* cited by examiner

*Primary Examiner* — Reema Patel
(74) *Attorney, Agent, or Firm* — Jianq Chyun IP Office

(57) ABSTRACT

A method of fabricating a semiconductor component that including the following steps is provided. A plurality of stacked structures is formed on a substrate. A first dielectric layer is formed to cover the stacked structures, wherein the first dielectric layer has a plurality of overhangs, the overhangs wrap top portions of the stacked structures. A dry conformable etching process is performed to conformably remove the first dielectric layer until a portion of the first dielectric layer located outside of the overhangs is removed. A second dielectric layer is formed on the stacked structures, wherein the second dielectric layer connects the adjacent overhangs to form an air gap between the stacked structures.

14 Claims, 2 Drawing Sheets

METHOD FOR MANUFACTURING SEMICONDUCTOR DEVICE

CROSS-REFERENCE TO RELATED APPLICATION

This application claims the priority benefit of Taiwan application serial no. 101123012, filed on Jun. 27, 2012. The entirety of the above-mentioned patent application is hereby incorporated by reference herein and made a part of this specification.

BACKGROUND OF THE INVENTION

1. Field of the Invention

The invention relates to a method of fabricating a semiconductor device.

2. Description of Related Art

Non-volatile memory is a type of memory that has been widely used inside personal computer systems and electron equipments. Data can be stored, read out or erased from the non-volatile memory countless number of times and any stored data is retained even after power supplying the devices is cut off.

In general, the typical non-volatile memory cell is designed to be comprised of a stacked gate structure including a floating gate and a control gate made of doped polysilicon. The floating gate is located between the control gate and a substrate in a floating state without connecting to other circuits, while the control gate is connected to a word line. Further, the non-volatile memory device also includes a tunneling dielectric layer disposed between the substrate and the floating gate, and an inter-gate dielectric layer disposed between the floating gate and the control gate.

Based on the design concept for improving the device integration, the sizes of the devices are reduced accordingly. In this case, an air gap ratio between the stacked gate structures (a ratio of a sectional area of the air gap to a sectional area of a space between the stacked structures) are usually increased to prevent resistor-capacitor delay (RC Delay) between the stacked gate structures, and floating gate coupling between the floating gates from increasing.

However, with the increasing degree of device integration, air gaps formed by using method of fabricating a non-volatile memory in prior art is relatively lower. As a result, the resistor-capacitor delay between the stacked gate structures and the floating gate coupling between the floating gates may not be effectively reduced.

SUMMARY OF THE INVENTION

Accordingly, the invention provides a method of fabricating a semiconductor device for increasing an air gap ratio between the stacked structures.

The present invention is directed to a method of fabricating a semiconductor component that includes the following steps. A plurality of stacked structures is formed on a substrate. A first dielectric layer is formed to cover the stacked structures, wherein the first dielectric layer has a plurality of overhangs, the overhangs wrap top portions of the stacked structures. A dry conformable etching process is performed to conformably remove the first dielectric layer until a portion of the first dielectric layer located outside of the overhangs is removed. A second dielectric layer is formed on the stacked structures, wherein the second dielectric layer connects the adjacent overhangs to form an air gap between the stacked structures.

According to an embodiment of the invention, in said method of fabricating the semiconductor device, the method further includes forming a liner layer to cover the stacked structures after the stacked structures are formed.

According to an embodiment of the invention, in said method of fabricating the semiconductor device, an etching rate of the liner layer is, for example, smaller than an etching rate of the first dielectric layer during the dry conformable etching process.

According to an embodiment of the invention, in said method of fabricating the semiconductor device, the dry conformable etching process is, for example, an isotropic etching process.

According to an embodiment of the invention, in said method of fabricating the semiconductor device, the dry conformable etching process is, for example, a non-plasma etching process or a plasma etching process.

According to an embodiment of the invention, in said method of fabricating the semiconductor device, the dry conformable etching process is, for example, a gas etching process.

According to an embodiment of the invention, in said method of fabricating the semiconductor device, the dry conformable etching process is, for example, adapted for line width of less than or equal to 50 nanometers.

According to an embodiment of the invention, in said method of fabricating the semiconductor device, a ratio of a sectional area of the air gap to a sectional area of a space between the stacked structures is, for example, higher than 70% and less than or equal to 90%.

According to an embodiment of the invention, in said method of fabricating the semiconductor device, when the semiconductor device is a non-volatile memory, each of the stacked structures successively includes a tunneling dielectric layer, a floating gate, an inter-gate dielectric layer and a control gate from bottom to top.

According to an embodiment of the invention, in said method of fabricating the semiconductor device, the dry conformable etching process may be used to remove a portion of the first dielectric layer located below or equal to a height of a top portion of each of the control gate.

According to an embodiment of the invention, in said method of fabricating the semiconductor device, a lower width of the air gap is larger than or equal to a upper width of the air gap between the floating gates.

According to an embodiment of the invention, in said method of fabricating the semiconductor device, each of the stacked structures further includes a conductor layer, disposed on each of the control gates.

According to an embodiment of the invention, in said method of fabricating the semiconductor device, each of the stacked structures further includes a cap layer, the cap layer is an uppermost layer of the stacked structure.

According to an embodiment of the invention, in said method of fabricating the semiconductor device, the dry conformable etching process may be used to remove a portion of the first dielectric layer located below or equal to a height of the bottom portion of the cap layer.

Based on above, the method of fabricating the semiconductor device of the invention may remove a portion of the first dielectric layer outside of the overhang, so that the air gap ratio between the stacked structures may be effectively increased, thereby improving overall performance of the semiconductor device.

To make the above features and advantages of the invention more comprehensible, several embodiments accompanied with drawings are described in detail as follows.

DESCRIPTION OF THE EMBODIMENTS

FIG. 1A to FIG. 1D are cross-sectional flowcharts, schematically illustrating the fabrication for a semiconductor device according to an embodiment of the invention. In the present embodiment, the semiconductor device is exemplified using a non-volatile memory, but the invention is not limited thereto. That is, as long as a method of fabricating the semiconductor device is applied forming an air gap formed between two stacked structures as disclosed in the present embodiment, such method falls in the scope of the invention.

Figure 1A:
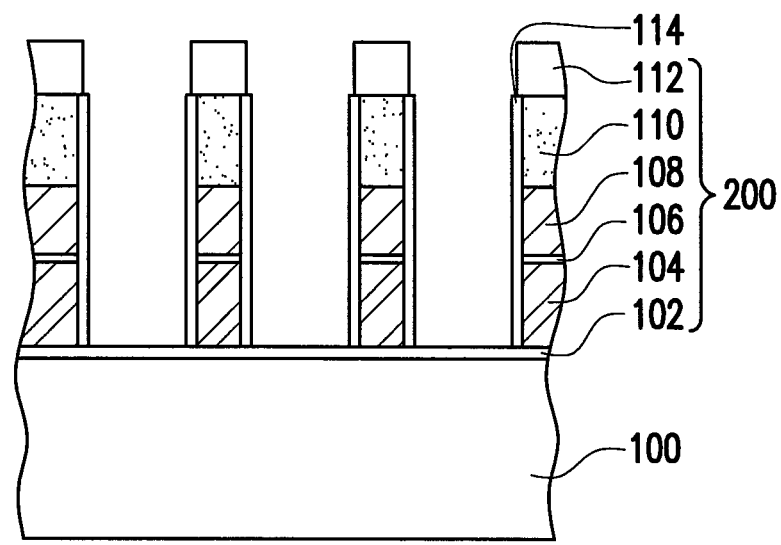
FIG. 1A to FIG. 1D are cross-sectional flowcharts, schematically illustrating the fabrication for a semiconductor device according to an embodiment of the invention.

Referring to FIG. 1A, stacked structures 200 are formed on a substrate 100. When the semiconductor device is a non-volatile memory, the stacked structure 200 may successively include a tunneling dielectric layer 102, a floating gate 104, an inter-gate dielectric layer 106 and a control gate 108 from bottom to top. The stacked structure 200 may be formed by, for example, performing a deposition process and a patterning process. The substrate 100 may be, for example, silicon substrate. The substrate 100 may be doped based to the practical needs, so that a doped area (not illustrated) may be formed in the substrate 100. The tunneling dielectric layer 102 may be, for example, silicon oxide. The tunneling dielectric layer 102 may be formed by, for example, performing a thermal oxidation process. A material of the floating gate 104 may be, for example, a doped polysilicon. The floating gate 104 may be formed by, for example, performing a CVD process. The inter-gate dielectric layer 106 may be, for example, a single layer structure or a multi layer structure. A material of the inter-gate dielectric layer 106 may be, for example, a silicon oxide or composite material of silicon oxide/silicon nitride/silicon oxide. The inter-gate dielectric layer 106 may be formed by, for example, performing a chemical vapor deposition process. A material of the control gate 108 may be, for example, a doped polysilicon. The control gate 108 may be formed by, for example, performing a CVD process.

In addition, the stacked structure 200 may selectively include a conductor layer 110 disposed on the control gate 108. The conductor layer 110 may be, for example, a metal silicide layer or a metal layer. A material of the metal silicide layer may be, for example, tungsten silicide. A material of the metal layer may be, for example, tungsten. When the conductor layer 110 is a metal silicide layer, the conductor layer 110 may be formed, for example, by performing a chemical vapor deposition process or a self-aligned silicide process.

In addition, the stacked structure 200 may selectively include a cap layer 112 disposed on the conductor layer 110. The cap layer 112 is, for example, an uppermost layer of the stack structure. A material of the cap layer 112, for example, is silicon nitride or silicon oxide. The cap layer 112 may be formed by, for example, performing a chemical vapor deposition method.

Next, a liner layer 114 may be selectively formed to cover the stacked structure 200 for preventing the stacked structure 200 from damage in the subsequent etching processes. A material of the liner layer 114 may be, for example, silicon oxide or silicon nitride. The liner layer 114 may be formed by, for example, using methods such as a chemical vapor deposition process, an In-Situ Steam Generation (ISSG) or an Atomic layer deposition.

Figure 1B:
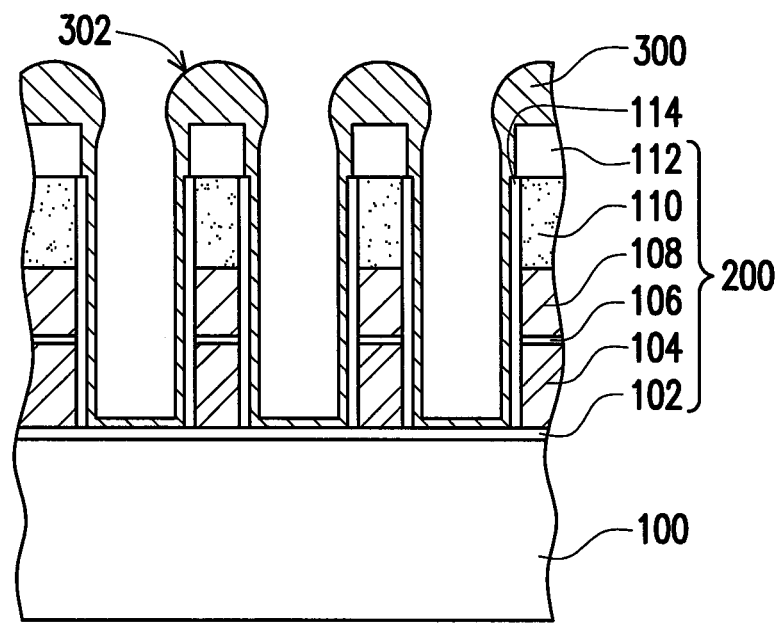

Referring to FIG. 1B, a first dielectric layer 300 is formed on the liner layer 114 to cover the stacked structure 200, in which the first dielectric layer 300 has overhangs 302, each of the overhangs 302 wrap top portions of the stacked structures 200. A thickness of the overhang 302 is larger than thicknesses of other positions of the first dielectric layer 300. A material of the first dielectric layer 300 may be, for example, silicon oxide. The first dielectric layer 300 may be formed by, for example, performing a chemical vapor deposition process.

Figure 1C:
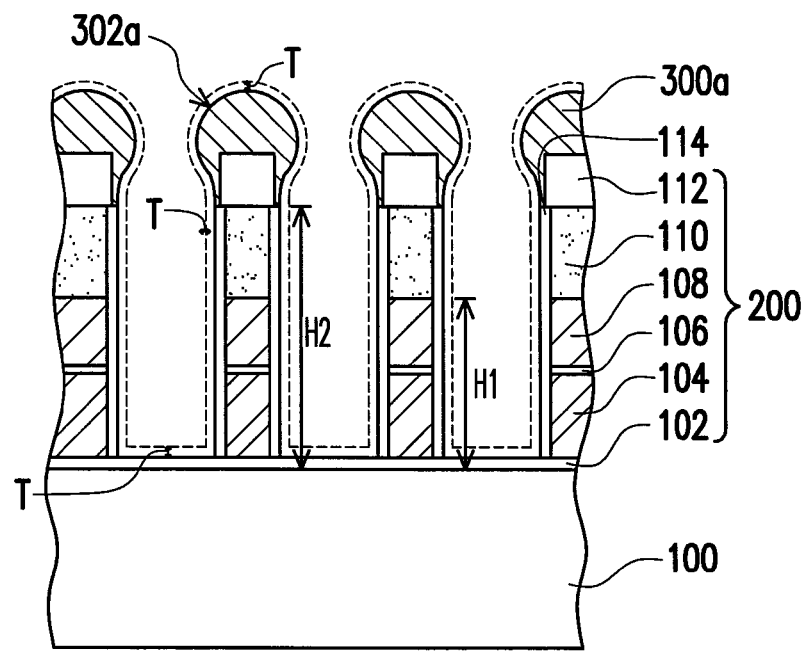

Referring to FIG. 1C, a dry conformable etching process is performed to conformably remove the first dielectric layer 300 until a portion of the first dielectric layer 300 located outside of the overhangs 302a is removed, thereby forming a first dielectric layer 300a having the overhang 302a. In addition, by using the dry conformable etching process, a portion of the first dielectric layer 300 located below or equal to a height H1 of a top portion of the control gate 108 may be removed, and even a portion of the first dielectric layer 300 located below or equal to a height H2 of a bottom portion of the cap layer 112 may also be further removed. In the present embodiment, it is exemplified by completely removing the portion of first dielectric layer 300 located below or equal to the height H2 of the bottom portion of the cap layer 112, but the invention is not limited thereto.

More specifically, during the dry conformable etching process, substantially the same thickness T of the first dielectric layer 300 is removed from each portion of the first dielectric layer 300. As a result, since the thickness of the overhang 302 is larger than the thickness of the other portion of the first dielectric layer 300, the shape of the overhang 302 on the first dielectric layer 300 may be maintained while the first dielectric layer 300 may be removed until the portions of the first dielectric layer 300 located outside (i.e. below or equal to the height H2 on the bottom portion of the cap layer 112) of the overhangs 302a are completely removed.

It should be noted that, during the dry conformable etching process, for example, the liner layer 114 and the first dielectric layer 300 may have different etching selection ratios. For example, when the materials used for the liner layer 114 and the first dielectric layer 300 are both silicon oxide, in the case where a silicon oxide density of the liner layer 114 is higher than a silicon oxide density of the first dielectric layer 300, an etching rate of the liner layer 114 is relatively smaller than an etching rate of the first dielectric layer 300 in the dry conformable etching process. Accordingly, the liner layer 114 may be used as a etching stop layer to protect the stacked structure 200 while performing etching process to the first dielectric layer 300.

Above said dry conformable etching process may be, for example, an isotropic etching process, which may be used to remove the first dielectric layer 300 located on sidewalls of the stacked structure 200 and the first dielectric layer 300 located between the stacked structure 200 on the substrate 100. In addition, the dry conformable etching process may also be a non-plasma etching process or a plasma etching process. Further, the dry conformable etching process may also be, for example, a gas etching process. Since gas may etch the dielectric layer 300 without being effected by surface tension, the method of fabricating semiconductor device of the invention may be adapted for line width of less than or equal to 50 nanometers, and further adapted for line width of less than 30 nanometers.

Figure 1D:
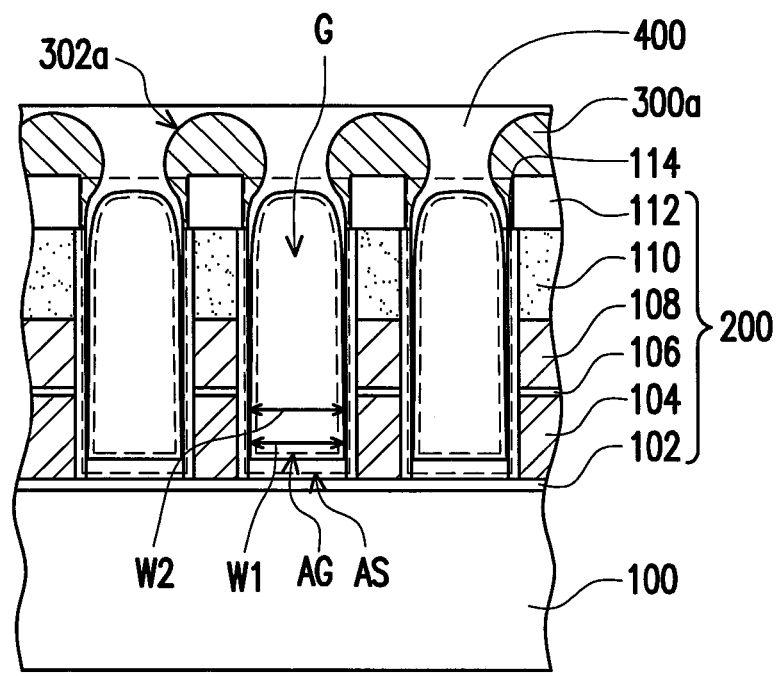

Referring to FIG. 1D, a second dielectric layer 400 is formed on the stacked structure 200, in which the second dielectric layer 400 connects the adjacent overhangs 302a to form an air gap G between the stacked structures 200. In other words, the air gap G is formed by performing rapid sealing the opening between the adjacent overhangs 302a by using the second dielectric layer 400 to connect the adjacent overhangs 302a in the present embodiment. A material of the second dielectric layer 400 may be, for example, silicon oxide. The second dielectric layer 400 may be formed by, for example, performing a chemical vapor deposition process, such as a high density plasma chemical vapor deposition (HDPCVD) process.

In addition, a lower width W1 of the air gap G is, for example, larger than or equal to a upper width W2 of the air gap G between the floating gates 104, such that the air gaps G located between the floating gates 104 may be formed in a shaped similar to a box shape. In other embodiments, the lower width W1 of the air gap G may be larger than or equal to a width of the air gap G (not illustrated) between other components (e.g. between the inter-gate dielectric layer 106) in the stacked structure 200.

Further, a ratio of a sectional area AG of the air gap G to a sectional area AS of a space between the stacked structures 200 (i.e. an air gap ratio) is higher than 70% and less than or equal to 90%. Therefore, the air gap ratio between the stacked structures 200 may be increased, so that the resistor-capacitor delay and the floating gate coupling may be effectively reduced. Accordingly, a value of gate-coupling ratio may be increased, thereby improving overall performance of the memory device.

Based on above embodiments, it can be known that: by conformably removing the portion of the first dielectric layer 300 outside of the overhangs 302a (e.g. below or equal to a height H1 on the top portion of the control gate 108 or below or equal to a height H2 on the bottom portion of the cap layer 112) by using dry conformable etching process, the air gap G formed by sealing the opening with the second dielectric layer 400 may have a larger air gap ratio. As a result, the resistor-capacitor delay between the stacked gate structures, and the floating gate coupling may be effectively reduced, so that a value of gate-coupling ratio may be increased, thereby improving overall performance of the semiconductor device.

In summary, the above embodiments have at least the following advantages:

1. With the method of fabricating semiconductor device in above embodiments, a semiconductor device with a larger air gap ratio may be fabricated.

2. When the method of fabricating semiconductor device in above embodiments is used for fabricating a non-volatile memory, the resistor-capacitor delay and the floating gate coupling may be effectively reduced, so that a value of gate-coupling ratio may be increased, thereby improving overall performance of the memory device.

Although the invention has been described with reference to the above embodiments, it is apparent to one of the ordinary skill in the art that modifications to the described embodiments may be made without departing from the spirit of the invention. Accordingly, the scope of the invention will be defined by the attached claims not by the above detailed descriptions.

What is claimed:

1. A method of fabricating a semiconductor device, comprising:
   forming a plurality of stacked structures on a substrate;
   forming a first dielectric layer to cover the stacked structures, wherein the first dielectric layer has a plurality of overhangs, the overhangs wrap top portions of the stacked structures;
   performing a dry conformable etching process to conformably remove the first dielectric layer until all portions of the first dielectric layer outside of the overhangs and along the sidewalls of the stacked structures are completely removed; and
   forming a second dielectric layer on the stacked structures, wherein the second dielectric layer connects the adjacent overhangs to form an air gap between the stacked structures.

2. The method of fabricating the semiconductor device of claim 1, further comprising forming a liner layer to cover the stacked structures after the stacked structures are formed.

3. The method of fabricating the semiconductor device of claim 2, wherein an etching rate of the liner layer is smaller than an etching rate of the first dielectric layer during the dry conformable etching process.

4. The method of fabricating the semiconductor device of claim 1, wherein the dry conformable etching process comprises an isotropic etching process.

5. The method of fabricating the semiconductor device of claim 4, wherein the dry conformable etching process comprises a non-plasma etching process or a plasma etching process.

6. The method of fabricating the semiconductor device of claim 1, wherein the dry conformable etching process comprises a gas etching process.

7. The method of fabricating the semiconductor device of claim 6, wherein the dry conformable etching process is adapted for a line width of less than or equal to 50 nanometers.

8. The method of fabricating the semiconductor device of claim 1, wherein a ratio of a sectional area of the air gap to a sectional area of a space between the stacked structures is higher than 70% and less than or equal to 90%.

9. The method of fabricating the semiconductor device of claim 1, wherein when the semiconductor device is a non-volatile memory, each of the stacked structures successively comprises a tunneling dielectric layer, a floating gate, an inter-gate dielectric layer and a control gate from bottom to top.

10. The method of fabricating the semiconductor device of claim 9, wherein the dry conformable etching process comprises: removing a portion of the first dielectric layer located below or equal to a height of a top portion of each of the control gates.

11. The method of fabricating the semiconductor device of claim 9, wherein a lower width of the air gap is larger than or equal to an upper width of the air gap between the floating gates.

12. The method of fabricating the semiconductor device of claim 9, wherein each of the stacked structures further comprises a conductor layer, disposed on each of the control gates.

13. The method of fabricating the semiconductor device of claim 1, wherein each of the stacked structures further comprises a cap layer, the cap layer is an uppermost layer of the stacked structure.

14. The method of fabricating the semiconductor device of claim 13, wherein the dry conformable etching process comprises removing a portion of the first dielectric layer located below or equal to a height of the bottom portion of the cap layer.

* * * * *